(12) United States Patent
Su et al.

(10) Patent No.: US 9,899,287 B2
(45) Date of Patent: Feb. 20, 2018

(54) FAN-OUT WAFER LEVEL PACKAGE STRUCTURE

(71) Applicant: Powertech Technology Inc., Hsinchu County (TW)

(72) Inventors: Ting-Feng Su, Hsinchu County (TW); Chia-Jen Chou, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/469,594

(22) Filed: Mar. 27, 2017

(65) Prior Publication Data

US 2017/0372981 A1 Dec. 28, 2017

(30) Foreign Application Priority Data

Jun. 27, 2016 (TW) .............................. 105120122 A (51) Int. Cl.
| | |
|---|---|
| *H01L 23/28* | (2006.01) |
| *H01L 23/52* | (2006.01) |
| *H01L 23/31* | (2006.01) |
| *H01L 23/498* | (2006.01) |
| *H01L 23/00* | (2006.01) |

(52) U.S. Cl.
CPC .... *H01L 23/3128* (2013.01); *H01L 23/49822* (2013.01); *H01L 23/49827* (2013.01); *H01L 23/49838* (2013.01); *H01L 24/06* (2013.01); *H01L 2224/024* (2013.01); *H01L 2224/02373* (2013.01); *H01L 2224/02379* (2013.01); *H01L 2224/0401* (2013.01)

(58) Field of Classification Search
CPC .......... H01L 23/3128; H01L 23/49827; H01L 23/49838; H01L 24/06; H01L 2224/0401; H01L 2224/02379; H01L 24/20
See application file for complete search history.

(56) References Cited

U.S. PATENT DOCUMENTS

| | | | |
|---|---|---|---|
| 8,537,523 B1 | 9/2013 | Chen et al. | |
| 2012/0187557 A1* | 7/2012 | Kyozuka | .................. H01L 24/19 257/734 |
| 2014/0124941 A1 | 5/2014 | Sakamoto | |
| 2015/0021754 A1* | 1/2015 | Lin | ..................... H01L 23/5389 257/712 |

FOREIGN PATENT DOCUMENTS

| | | |
|---|---|---|
| TW | I301660 | 10/2008 |
| TW | 201218344 | 5/2012 |
| TW | 201318128 | 5/2013 |
| TW | 201417220 | 5/2014 |

* cited by examiner

Primary Examiner — Jasmine Clark
(74) Attorney, Agent, or Firm — JCIPRNET (57) ABSTRACT

A fan-out wafer level package structure includes a chip, a molding compound, at least one circuit layer, and at least one dielectric layer. The molding compound encapsulates the chip. The at least one circuit layer is disposed on a surface of the chip and a surface of the molding compound coplanar to the surface of the chip. The at least one circuit layer includes a plurality of traces. Each of the traces includes a first portion and a second portion. The first portion is located at an edge region of a projection of the chip onto the dielectric layer. A width of the first portion is larger than a width of the second portion. The at least one dielectric layer is disposed at a side of the at least one circuit layer.

18 Claims, 5 Drawing Sheets

FAN-OUT WAFER LEVEL PACKAGE STRUCTURE

CROSS REFERENCE TO RELATED APPLICATION

This application claims the priority benefit of Taiwan application serial no. 105120122, filed on Jun. 27, 2016. The entirety of the above-mentioned patent application is hereby incorporated by reference herein and made a part of specification.

BACKGROUND OF THE INVENTION

Field of the Invention

The invention relates to a fan-out wafer level package structure, and particularly relates to a fan-out wafer level package structure in which traces are not easily broken.

Description of Related Art

In the semiconductor industry, manufacturing of integrated circuits (IC) mainly includes three stages: IC design, IC process and IC package. Specifically, a die may be manufactured through steps such as wafer fabrication, circuit design, optical mask fabrication, wafer dicing, etc. For example, the die may be electrically connected to a carrier (i.e. a leadframe, a substrate, etc) through wire bonding or flip chip bonding, etc. As such, the contact points of the bonding pads of the die can be redistributed to the periphery of the die or underneath an active surface of the die. After the contact points of the bonding pads of the die have been redistributed, a molding compound is adopted to encapsulate the die for protection.

When a required number of connections cannot be achieved within the chip area, a fan-out wafer level packaging (FOWLP) can be adopted to provide flexibility in circuit layout designs. For example, from a top view, traces are pull out from the center of the wafer and are spread out to form a "fan-out" shape. The specific manufacturing method of the FOWLP structure may include the following steps. First, the molding compound is used to package regions of the chip other than the active surface. Subsequently, traces are formed on the active surface of the chip and the molding compound to pull out contacts of the chip to the molding compound through the traces. Thereafter, a dielectric layer, a redistribution circuit layer (RDL), and a plurality of solder ball bonding pads are formed on the chip and the molding compound. Finally, solder balls are configured on the solder ball bonding pads to complete the package.

After the FOWLP structure is completed, a reliability test is performed to evaluate whether the FOWLP structure is able to withstand a temperature variation. However, due to the difference in thermal expansion coefficients of the chip and the molding compound, the degrees of thermal expansion and contraction between different components (for example, the chip and the molding compound) of the FOWLP structure may also vary when temperature variation occurs. As a result, the traces disposed on the dielectric layer at proximity of a junction of the chip and the molding compound (i.e. an edge of the chip) may be easily broken.

SUMMARY OF THE INVENTION

The invention is directed to a fan-out wafer level package structure, in which traces formed therein are not easily broken.

The invention provides a fan-out wafer level package structure including a chip, a molding compound, at least one circuit layer, and at least one dielectric layer. The molding compound encapsulates the chip. The at least one circuit layer is disposed on a surface of the chip and a surface of the molding compound coplanar to the surface of the chip. The at least one circuit layer includes a plurality of traces. The dielectric layer is disposed at a side of the at least one circuit layer. Each of the traces includes a first portion and a second portion. The first width portion is located at an edge region of a projection of the chip onto the dielectric layer. A width of the first portion is larger than a width of the second portion.

The invention provides another fan-out wafer level package structure including a chip, a molding compound, at least one circuit layer, at least one dielectric layer, and at least one reinforcement member. The molding compound encapsulates the chip. The at least one circuit layer is disposed on a surface of the chip and a surface of the molding compound coplanar to the surface of the chip. The at least one circuit layer includes a plurality of traces. The dielectric layer is disposed at a side of the at least one circuit layer. The at least one reinforcement member is embedded in the at least one dielectric layer and is disposed above an edge region of the chip.

According to the above descriptions, the traces near the edge region of the projection of the chip onto the dielectric layer may be easily broken due to difference in degrees of thermal expansion and contraction between the chip and the molding compound of the fan-out wafer level package structure when temperature variation occurs. In order to avoid such situation, in the fan-out wafer level package structure of the invention, the trace width of a portion of the traces at the edge region of the projection of the chip onto the dielectric layer is designed to be larger than the trace width of the other portion of the traces at regions other than the edge region. Therefore, the traces located near the edge region of the projection of the chip onto the dielectric layer may have better strength. Alternatively, in the fan-out wafer level package structure of the invention, the reinforcement members are configured on the dielectric layer at the edge region of the projection of the chip onto the dielectric layer to provide enhanced support for the traces near the edge region of the projection. Therefore, the stresses generated due to mismatch in degrees of the thermal expansion and contraction between the chip and the molding compound may be dispersed, thereby decreasing the possibility of broken traces in the said region caused by the pulling force derived from the chip and the molding compound due to the temperature variation. The aforementioned design of the traces or configuration of the reinforcement members may also improve durability of the fan-out wafer level package structure to render better collision endurance ability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
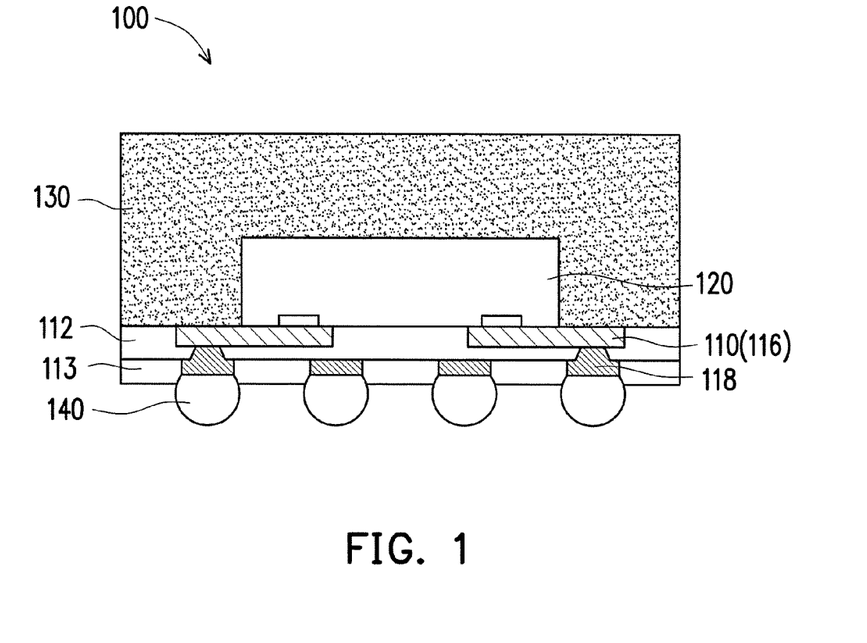
FIG. 1 is a cross-sectional view of a fan-out wafer level package structure according to an embodiment of the invention.

FIG. 1 is a cross-sectional view of a fan-out wafer level package structure according to an embodiment of the invention. The fan-out wafer level package structure 100 of the present embodiment includes a chip 120, a molding compound 130, at least one circuit layer 110, at least one dielectric layer 112, 113, and a plurality of solder balls 140.

Since the chip 120 has a small dimension and contacts of the chip 120 are close to each other, a required circuit configuration may not be easily manufactured within the chip area. In the present embodiment, by pulling the circuit outward to a lower surface of the molding compound 130, flexibility in circuit layout designs may be provided.

The chip 120 may be encapsulated by the molding compound 130 while an active surface of the chip 120 is exposed. A lower surface of the molding compound 130 is substantially coplanar to the active surface of the chip 120. The circuit layer 110, the dielectric layers 112, 113, and a plurality of solder ball contacts 118 may be formed above the active surface of the chip 120 and the lower surface of the molding compound 130. A material of the dielectric layers 112, 113 may include, but is not limited to, polyimide (PI). A method for forming the circuit layer 110 and the solder ball contacts 118 may include, but is not limited to, the following steps:

Step 001: a conductive layer is plated on the dielectric layer 112, the active surface of the chip 120, and the lower surface of the molding compound 130 through electroplating.

Step 002: a plurality of contacts 114, a plurality of traces 116, and the solder ball contacts 118 are formed through etching. The contacts 114 and the traces 116 may be located in a same plane. The contacts of the chip are connected to the solder ball contacts 118 located at the lower surface of the dielectric layer 112 through the contacts 114 and the traces 116 located at the upper surface of the dielectric layer 112.

A thermal expansion coefficient of the chip 120 of the fan-out wafer level package structure 100 may be different from a thermal expansion coefficient of the molding compound 130 of the fan-out wafer level package structure 100. When a temperature variation occurs, the degrees of thermal expansion and contraction between the chip 120 and the molding compound 130 may be different, and stress is generated to the dielectric layer 112 disposed at a junction between the chip 120 and the molding compound 130. When an elastic modulus of the dielectric layer 112 is low, the traces 116 on the dielectric layer 112 are subjected to more stress. As a result, the traces 116 at the proximity of the junction of the chip 120 and the molding compound 130 (i.e. a portion of the traces 116 close to the edge of the chip 120) may be easily broken. In order to reduce the probability of breaking the traces 116, width of the traces 116 at sections close to the junction of the chip 120 and the molding compound 130 are adjusted to increase a strength of said sections of the traces 116.

Figure 2:
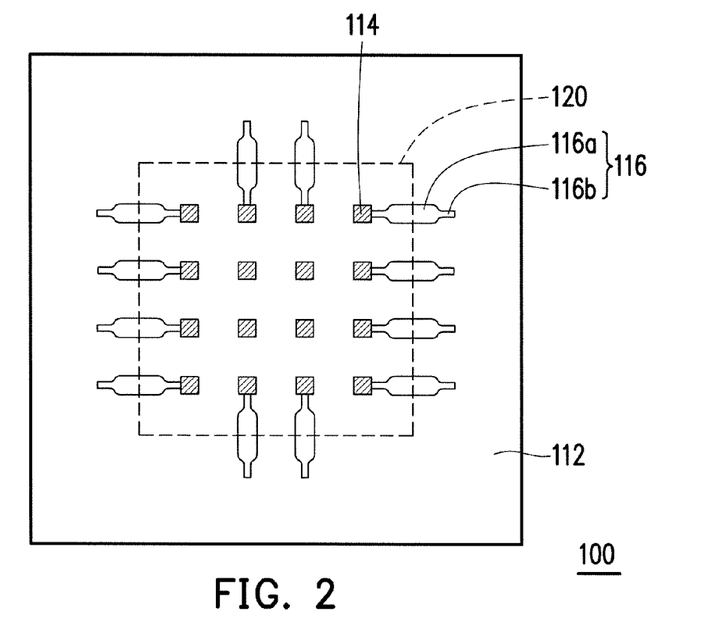
FIG. 2 is a top view of the fan-out wafer level package structure of FIG. 1 with hidden molding compound and chip.

FIG. 2 is a top view of the fan-out wafer level package structure of FIG. 1 with hidden molding compound and chip. It should be noted that in order to clearly indicate a width variation in the traces 116, the molding compound 130 and the chip 120 are hidden in FIG. 2. In addition, in order to present relative positions of the traces 116 and the chip 120, the position of the chip 120 is only indicated by dotted lines for simplicity. Moreover, in FIG. 2, positions of the traces 116 on the dielectric layer 112 and a width variation ratio of different sections of the traces 116 are only schematically indicated, and the invention is not limited thereto.

Referring to FIG. 2, each of the traces 116 includes a first portion 116a and a second portion 116b. The first portion 116a is located close to an edge region of a projection of the chip 120 onto the dielectric layer 112, and the second portion 116b is located away from the edge region of the projection of the chip 120 onto the dielectric layer 112. As illustrated in FIG. 2, a trace width of a portion of the traces 116 at the edge region of the projection of the chip 120 onto the dielectric layer 112 is larger than a trace width of the other portion of the traces 116 at regions other than the edge region. The width of the first portion 116a of each trace 116 is greater than the width of the second portion 116b. By broadening a specific section of each trace 116 that may be easily broken due to difference in degrees of thermal expansion and contraction between the chip 120 and the molding compound 130, the strength of the said section of the traces 116 may be enhanced. In this way, the portions (i.e. the first portions 116a) of the traces 116 located near the edge region of the projection of the chip 120 onto the dielectric layer 112 may not be easily broken.

The method for reducing the possibility of breakage in the portions of the traces 116 near the edge region of the chip 120 is not limited to the above description. Other fan-out wafer level package structures are described below.

Figure 3:
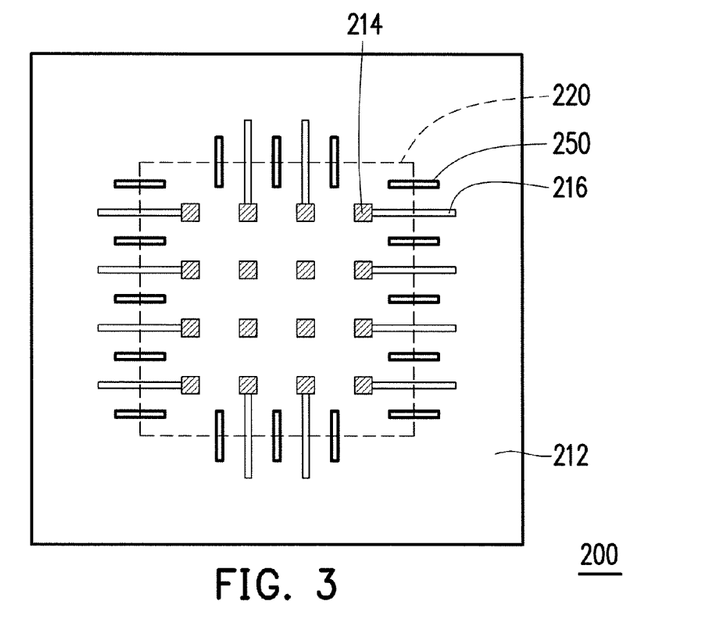
FIG. 3 and FIG. 4 are respectively top views of fan-out wafer level package structures with hidden molding compound and chip according to other embodiments of the invention.
Figure 4:
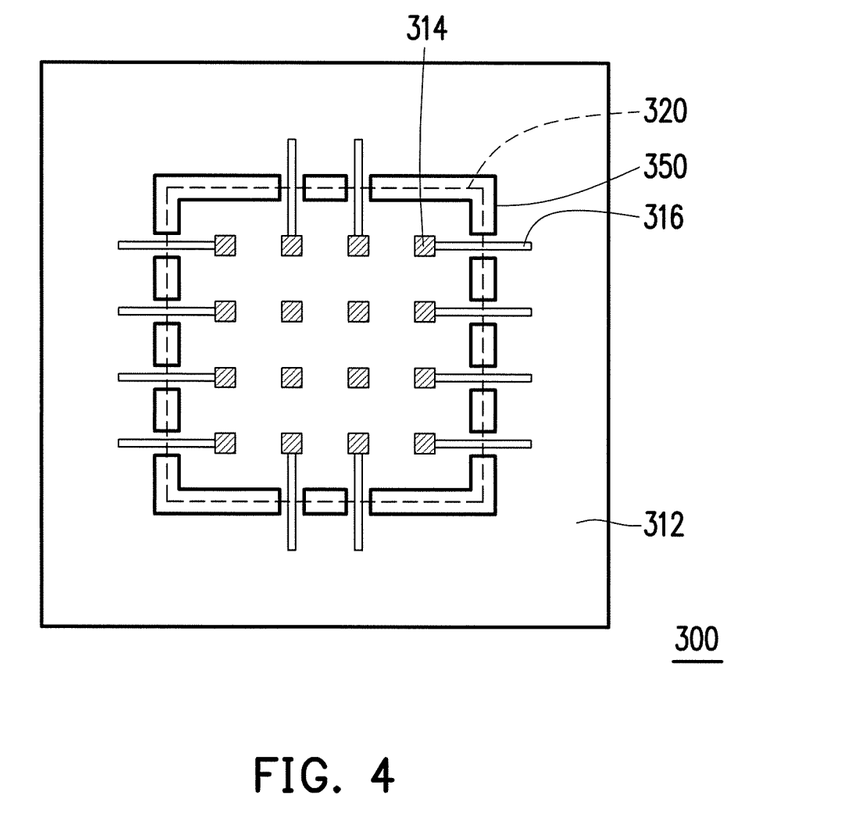

FIG. 3 and FIG. 4 are respectively top views of fan-out wafer level package structures with hidden molding compound and chip according to other embodiments of the invention. Similarly, in FIG. 3 and FIG. 4, the molding compound and the chip are hidden in order to clearly indicate the positions of reinforcement members 250, 350. A difference between FIG. 3 and FIG. 2 is that in the fan-out wafer level package structure 200 of FIG. 3, a width of each trace 216 is the same. Moreover, the fan-out wafer level package structure 200 further includes a plurality of reinforcement members 250. A portion of each of the reinforcement members 250 is disposed between the dielectric layer 212 and the chip 220 and another portion of each of the reinforcement members 250 is disposed between the dielectric layer 212 and the molding compound (not shown). The reinforcement members 250 are also located at the edge region of the projection of the chip 220 onto the dielectric layer 212.

The reinforcement members 250 are disposed around the perimeter of the chip 220, and are located above the edge region of the chip 220. The traces 216 are respectively disposed between adjacent reinforcement members 250. Namely, each of the traces 216 is located between two adjacent reinforcement members 250. A material of the reinforcement members 250 may be a conductive material. For example, the material of the reinforcement members 250 may be a material identical to that of the contacts 214 and the traces 216. The contacts 214, the traces 216, and the reinforcement members 260 may be coplanar to each other and may be fabricated at the same time. The reinforcement members 250 and the traces 216 are separate from each other, so the reinforcement members 250 are not used for electrical conduction. Moreover, although FIG. 3 depicted that the reinforcement members 250 respectively have a stripe shape and an extending direction of each reinforcement member 250 is parallel to the adjacent trace 216, the shape and the extending direction of each of the reinforcement members 250 are not limited thereto.

Similarly, when the temperature variation occurs, the degrees of thermal expansion and contraction between the chip 220 and the molding compound may be different, and stress is generated to the dielectric layer 120 disposed at a junction between the chip 120 and the molding compound 130. When an elastic modulus of the dielectric layer 212 is low, the traces 216 on the dielectric layer 212 are subjected to more stress. As a result, the traces 216 at proximity of the junction of the chip 220 and the molding compound (i.e. a portion of the traces 216 close to the edge of the chip 220) may be easily broken. In the fan-out wafer level package structure 200 of the present embodiment, the reinforcement members 250 are adopted to enhance a strength of the dielectric layer 212 at the region corresponding to the edge of the chip 220, so as to provide enhanced support for the traces 216 located near the edge region of the projection of the chip 220 onto the dielectric layer 212. Therefore, the stress generated due to mismatch in degrees of the thermal expansion and contraction between the chip 220 and the molding compound may be dispersed, thereby decreasing the possibility of broken traces 216 in the said region caused by the pulling force derived from the chip 220 and the molding compound due to the temperature variation.

A difference between the fan-out wafer level package structure 300 of FIG. 4 and the fan-out wafer level package structure 200 of FIG. 3 is that in FIG. 4, an overall shape and an extending direction of the reinforcement members 350 are close to a profile of the chip 320. Namely, projections of the reinforcement members 350 onto the dielectric layer 312 extend along a profile of the projection of the chip 320 onto the dielectric layer 312 to form a discontinuous quadrilateral shape. A dimension of an outer edge of the reinforcement members 350 (i.e. the discontinuous quadrilateral shape) may be greater than a dimension of the chip 320, and a dimension of an inner edge of the reinforcement members 350 may be smaller than the dimension of the chip 320. The reinforcement members 350 cover the junction of the chip 320 and the molding compound, and the discontinuous portions of the reinforcement members 350 are provided for the traces 316 to pass through. Namely, each of the traces 316 is formed between two portions of the reinforcement members 350. FIG. 3 and FIG. 4 only provide two exemplary shapes of the reinforcement members 250, 350, and the shapes, configurations, and positions of the reinforcement members 250, 350 are not limited thereto. Moreover, a material of the reinforcement members 250, 350 may also include an insulating material, and the insulated reinforcement members may take the shapes and the forms illustrated in FIG. 3 and FIG. 4.

Figure 5:
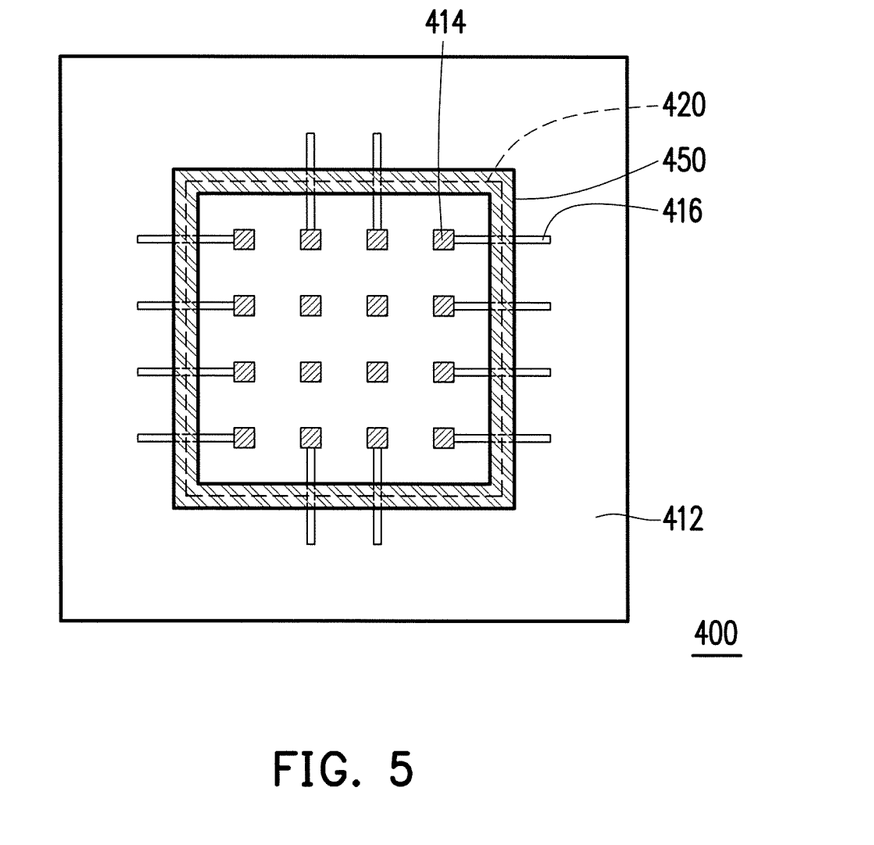
FIG. 5 is a top view of a fan-out wafer level package structure with hidden molding compound and chip according to another embodiment of the invention.

FIG. 5 is a top view of a fan-out wafer level package structure with hidden molding compound and chip according to another embodiment of the invention. A difference between the fan-out wafer level package structure 400 of FIG. 5 and the fan-out wafer level package structure 300 of FIG. 4 is that in the fan-out wafer level package structure 400 of FIG. 5, the reinforcement member 450 takes a form of a closed ring shape and a material of the reinforcement member 450 is an insulating material. Therefore, the reinforcement member 450 may directly cover the traces 416 without electrically conducting with the traces 416. The reinforcement member 450 is disposed at the junction of the chip 420 and the molding compound. Similarly, a portion of the reinforcement member 450 is located between the dielectric layer 412 (where the contacts 414 are located) and the chip 420 and another portion of the reinforcement member 450 is located between the dielectric layer 412 (where the contacts 414 are located) and the molding compound (not shown). Moreover, the reinforcement member 450 is located above the edge region of the chip 420. Namely, a projection of the reinforcement member 450 onto the dielectric layer 412 extends along a profile of the projection of the chip 420 onto the dielectric layer 412 to form a quadrilateral shape. A dimension of an outer edge of the reinforcement member 450 (i.e. a dimension of an outer edge of the quadrilateral shape) may be greater than a dimension of the chip 420 and a dimension of an inner edge of the reinforcement member 450 may be smaller than the dimension of the chip 420, so as to provide enhanced support for the traces 416 located near the edge region of the projection of the chip 420 onto the dielectric layer 412. Therefore, the stress generated due to mismatch in degrees of the thermal expansion and contraction between the chip 420 and the molding compound may be dispersed.

Figure 6:
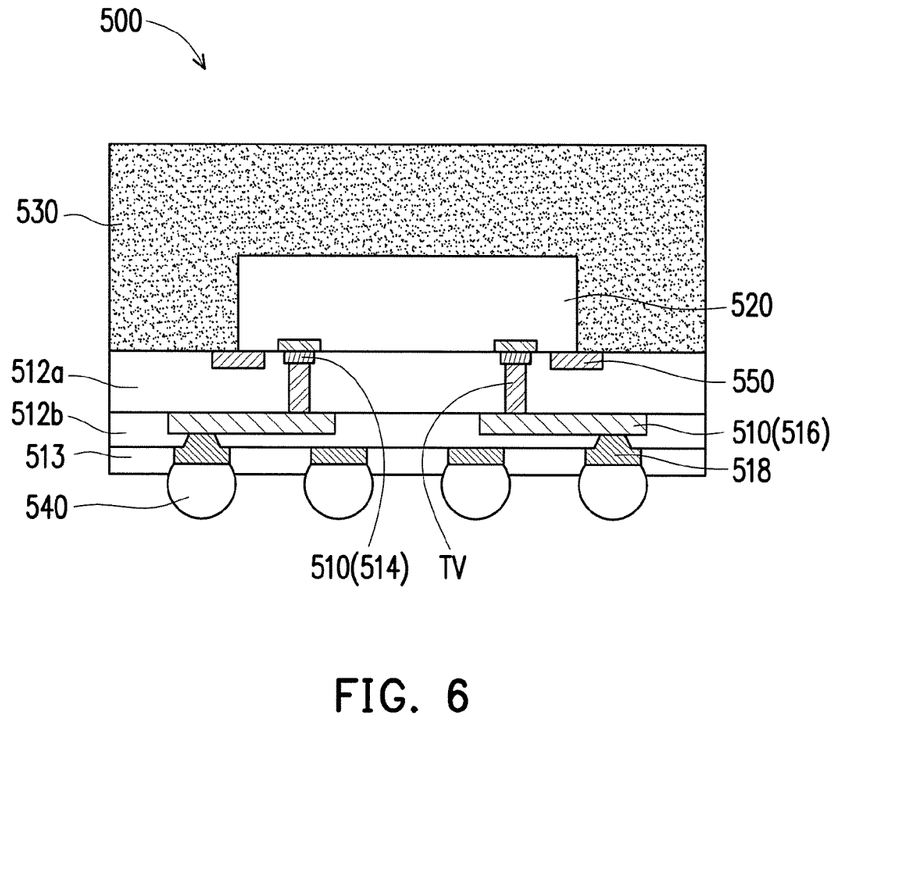
FIG. 6 is a cross-sectional view of a fan-out wafer level package structure according to another embodiment of the invention.

FIG. 6 is a cross-sectional view of a fan-out wafer level package structure 500 according to another embodiment of the invention. The fan-out wafer level package structure 500 of the present embodiment is similar to the fan-out wafer level package structure 100 of FIG. 1, so similar elements are denoted by similar reference numeral and the detailed descriptions thereof are omitted herein. The difference between FIG. 1 and FIG. 6 is that the fan-out wafer level package structure 500 of FIG. 6 further includes a reinforcement member 550, a plurality of circuit layers 510, and a plurality of dielectric layers 512 (upper dielectric layer 512a and lower dielectric layer 512b). As shown in FIG. 6, the upper circuit layer 510 includes a plurality of contacts 514, and the lower circuit layer 510 includes a plurality of traces 516. The contacts 514 are embedded in the upper dielectric layer 512a and the traces 516 are embedded in the lower dielectric layer 512b. The contacts 514 and the traces 516 are electrically connected through conductive vias TV penetrating through the upper dielectric layer 512a. In some embodiments, each trace 516 may have variation in width among different portions similar to that of the traces 116 in FIG. 1 and FIG. 2. In some alternative embodiments, each trace 516 may have substantially consistent width similar to that of the traces 216 in FIG. 3. The traces 516 and the reinforcement member 550 are separated by the upper dielectric layer 512a and are not electrically connected with each other. The reinforcement member 550 has a closed ring shape. The reinforcement member 550 is located in a same plane with the contacts 514 and is located on the edge region of the projection of the chip 520 onto the upper dielectric layer 512. The reinforcement member 550 is disposed at the junction of the chip 520 and the molding compound 530, and is adapted to provide enhanced support for the traces 516 located near the edge region of the projection of the chip 520 onto the dielectric layer 512. In some embodiments, the reinforcement member 550 is disposed directly above a meeting edge of the chip 520 and the molding compound 530. Therefore, the stress generated due to mismatch in degrees of the thermal expansion and contraction between the chip 520 and the molding compound 530 may be dispersed. It should be noted that in some embodiments, the upper circuit layer 510 (the contacts 514) may be omitted. Under this circumstance, the conductive vias TV may be directly formed on the surfaces of the pads of the chip 520 and the traces 516 are electrically connected to the chip 520 through the conductive vias TV.

A shape and an extending direction of the reinforcement member 550 is similar to a profile of the chip 520, and the reinforcement member 550 takes the form of a complete quadrilateral shape. A dimension of an outer edge of the reinforcement member 550 may be greater than a dimension of the chip 520, and a dimension of an inner edge of the reinforcement member 550 may be smaller than the dimension of the chip 520. Moreover, a material of the reinforcement member 550 may be a conductive material, and the reinforcement member 550 surrounds the contacts 514 without connecting to the contacts 514. In other embodiments, the material of the reinforcement member 550 may also include an insulating material.

It should be noted that the foregoing configuration of the reinforcement member 550 is merely an illustrative example and it construes no limitation in the invention. In some alternative embodiments, the reinforcement member 550 may be disposed on an interface between the upper dielectric layer 512a and the lower dielectric layer 512b such that the reinforcement member 550 is located between the upper circuit layer 510 (contacts 514) and the lower circuit layer 510 (traces 516). In other words, the reinforcement member 550 covers at least a portion of the traces 516. Under this scenario, in order for the reinforcement member 550 to be electrically insulated from the traces 516, the reinforcement member 550 is made of insulating material.

In the fan-out wafer level package structure 500 having multiple circuit layers as shown in FIG. 6, the reinforcement members shown in FIG. 3 to FIG. 5 may also be disposed in the same plane (i.e. the lower circuit layer) as that of the traces, and the reinforcement members are not limited to be only disposed in the same plane with the contacts (i.e. the upper circuit layer). Alternatively, the design in which the trace width of a portion of the traces at the edge region of the projection of the chip onto the dielectric layer is larger than the trace width of the other portion of the traces at regions other than the edge region may also be adopted, and the invention is not limited to the embodiment of FIG. 6.

In summary, the traces near the edge region of the projection of the chip onto the dielectric layer may be easily broken due to difference in degrees of thermal expansion and contraction between the chip and the molding compound of the fan-out wafer level package structure when temperature variation occurs. In order to avoid such situation, in the fan-out wafer level package structure of the invention, the trace width of a portion of the traces at the edge region of the projection of the chip onto the dielectric layer is designed to be larger than the trace width of the other portion of the traces at regions other than the edge region. Therefore, the traces located near the edge region of the projection of the chip onto the dielectric layer may have better strength. Alternatively, in the fan-out wafer level package structure of the invention, the reinforcement members are configured on the dielectric layer at the edge region of the projection of the chip onto the dielectric layer to provide enhanced support for the traces near the edge region of the projection. Therefore, the stress generated due to mismatch in degrees of the thermal expansion and contraction between the chip and the molding compound may be dispersed, hereby decreasing the possibility of broken traces in the said region caused by the pulling force derived from the chip and the molding compound due to the temperature variation. The aforementioned design of the traces or configuration of the reinforcement members may also improve durability of the fan-out wafer level package structure to render better collision endurance ability.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A fan-out wafer level package structure, comprising:
   a chip;
   a molding compound, encapsulating the chip;
   at least one circuit layer, disposed on a surface of the chip and a surface of the molding compound coplanar to the surface of the chip, and comprising a plurality of traces and a plurality of contacts, wherein the contacts and the traces are located in a same plane; and
   at least one dielectric layer, disposed at a side of the at least one circuit layer, wherein each of the traces comprises a first portion and a second portion, the first portion is located above an edge region of the chip, and a width of the first portion is larger than a width of the second portion.

2. The fan-out wafer level package structure as claimed in claim 1, wherein the second portion is located away from the edge region.

3. The fan-out wafer level package structure as claimed in claim 1, wherein the contacts are electrically connected to the corresponding traces.

4. The fan-out wafer level package structure as claimed in claim 1, wherein the dielectric layer is a flexible dielectric layer.

5. A fan-out wafer level package structure, comprising:
   a chip;
   a molding compound, encapsulating the chip;
   at least one circuit layer, disposed on a surface of the chip and a surface of the molding compound coplanar to the surface of the chip, wherein the at least one circuit layer comprises a plurality of traces; and
   at least one dielectric layer, disposed at a side of the at least one circuit layer; and
   at least one reinforcement member, embedded in the at least one dielectric layer, wherein the at least one reinforcement member is disposed above an edge region of the chip.

6. The fan-out wafer level package structure as claimed in claim 5, wherein the at least one reinforcement member comprises a plurality of the reinforcement members disposed around the perimeter of the chip.

7. The fan-out wafer level package structure as claimed in claim 6, wherein a material of the reinforcement members is a conductive material, each of the traces is disposed between two adjacent reinforcement members, and the reinforcement members are coplanar with the traces and are separate from the traces.

8. The fan-out wafer level package structure as claimed in claim 5, wherein the at least one reinforcement members comprises a plurality of the reinforcement members shaped in a discontinuous quadrilateral shape disposed around the perimeter of the chip.

9. The fan-out wafer level package structure as claimed in claim 8, wherein a dimension of an outer edge of the discontinuous quadrilateral shape is greater than a dimension of the chip, and a dimension of an inner edge of the discontinuous quadrilateral shape is smaller than the dimension of the chip.

10. The fan-out wafer level package structure as claimed in claim 8, wherein the plurality of the reinforcement members shaped in the discontinuous quadrilateral shape are formed in the same plane as the plurality of traces.

11. The fan-out wafer level package structure as claimed in claim 5, wherein the at least one reinforcement member is one single reinforcement member, the reinforcement member takes a form of a closed ring shape.

12. The fan-out wafer level package structure as claimed in claim 11, wherein a dimension of an outer edge of the quadrilateral shape is greater than a dimension of the chip, and a dimension of an inner edge of the quadrilateral shape is smaller than the dimension of the chip.

13. The fan-out wafer level package structure as claimed in claim 12, wherein the traces are electrically connected to the chip through a plurality of conductive vias penetrating through the at least one dielectric layer.

14. The fan-out wafer level package structure as claimed in claim 13, wherein the reinforcement member is disposed directly above a meeting edge of the chip and the molding compound.

15. The fan-out wafer level package structure as claimed in claim 13, wherein the at least one circuit layer further comprises a plurality of contacts disposed on the chip and coplanar with the reinforcement member.

16. The fan-out wafer level package structure as claimed in claim 11, wherein the quadrilateral shape overlaps with the perimeter of the chip.

17. The fan-out wafer level package structure as claimed in claim 11, wherein a material of the reinforcement member is an insulting material, and the reinforcement member covers at least a portion of the traces.

18. The fan-out wafer level package structure as claimed in claim 5, wherein the dielectric layer is a flexible dielectric layer.

\* \* \* \* \*